(12) United States Patent
Hou et al.

(10) Patent No.: US 12,260,891 B2
(45) Date of Patent: Mar. 25, 2025

(54) MFMFET, MFMFET ARRAY, AND THE OPERATING METHOD THEREOF

(71) Applicant: National YANG MING Chiao Tung University, Hsinchu (TW)

(72) Inventors: Tuo-Hung Hou, Hsinchu (TW); Ming-Hung Wu, Hsinchu (TW)

(73) Assignee: NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 155 days.

(21) Appl. No.: 17/982,156

(22) Filed: Nov. 7, 2022

(65) Prior Publication Data

US 2024/0038287 A1 Feb. 1, 2024

(30) Foreign Application Priority Data

Jul. 28, 2022 (TW) .................................. 111128451

(51) Int. Cl.
  *G11C 11/22* (2006.01)
(52) U.S. Cl.
  CPC ........ *G11C 11/223* (2013.01); *G11C 11/2259* (2013.01); *G11C 11/2273* (2013.01)
(58) Field of Classification Search
  CPC ........................................... G11C 11/22–2297
  See application file for complete search history.

(56) References Cited

U.S. PATENT DOCUMENTS

| 6,510,073 B1 * | 1/2003 | Lee ..................... G11C 11/22 |
| | | 257/295 |
| 2002/0161977 A1 * | 10/2002 | Chien ................ G11C 11/406 |
| | | 711/149 |

OTHER PUBLICATIONS

J. Hur et al., "A Technology Path for Scaling Embedded FeRAM to 28nm with 2T1C Structure", 2021 IEEE International Memory Workshop (IMW), 2021, pp. 1-4.

S. Slesazeck et al., "Uniting The Trinity of Ferroelectric HfO2 Memory Device in a Single Memory Cell", 2019 IEEE 11th International Memory Workshop (IMW), 2019, pp. 1-4.

* cited by examiner

*Primary Examiner* — Alfredo Bermudez Lozada
(74) *Attorney, Agent, or Firm* — Volpe Koenig

(57) ABSTRACT

A metallic ferroelectric metal (MFM) field effect transistor (FET) is provided that includes an MFM, a first FET and a second FET. The MFM has a first electrode. The first FET is electrically connected to the first electrode, and has a first gate electrode, wherein the first gate electrode has a first area. The second FET is electrically connected to the first electrode, and has a second gate electrode, wherein the second gate electrode has a second area, and the first area and the second area have a ratio therebetween ranging from 1:50 to 1:2.

15 Claims, 7 Drawing Sheets

MFMFET, MFMFET ARRAY, AND THE OPERATING METHOD THEREOF

CROSS-REFERENCE TO RELATED APPLICATION AND CLAIM OF PRIORITY

The application claims the benefit of Taiwan Application No. 111128451, filed on Jul. 28, 2022, at the TIPO, the disclosures of which are incorporated herein in their entirety by reference.

FIELD OF THE INVENTION

The present disclosure relates to memory cells and memory arrays, and particularly to memory cells comprising ferroelectric materials, memory arrays, and the operating method thereof.

BACKGROUND OF THE INVENTION

Ferroelectric (FE) materials are materials that have spontaneous polarization; that is, in the absence of an electric field, the positive/negative charge centers are separated in the unit cell structure to form an electric dipole material. In ferroelectric materials, the electric dipole directions of the spontaneous polarization are not consistent, but in a specific region, the spontaneous polarization direction of each unit cell is the same, and this specific region is called ferroelectric domains.

The polarization direction and intensity of the ferroelectric domains are different, and they are randomly distributed in the whole material. After canceling each other out, the whole ferroelectric material has no polarization phenomenon. After applying an electric field to a ferroelectric material, the polarization directions of each ferroelectric domain tend to be consistent and reach the saturation polarization (Ps).

When the electric field exceeds the positive coercive field (+Ec) or is lower than the negative coercive field (−Ec), the direction of the electric dipole of the ferroelectric material can be changed. When the applied electric field is removed, there will still be residual polarization (Pr) in the ferroelectric material, so it is very suitable for non-volatile memory devices.

In the U.S. Pat. No. 6,510,073, the read and write operating schemes for a single two-transistor (2T)-metal ferroelectric metal field effect transistor (MFMFET) were first proposed. For the read scheme, the dipole of the FE flips to the +Pr state to charge the floating gate, but a negative voltage is required to operate the word line.

J. Hur et al. proposed "A Technology Path for Scaling Embedded FeRAM to 28 nm with 2T1C Structure," 2021 IEEE International Memory Workshop (IMW), 2021, pp. 1-4; in their paper, the array architecture and the read and write operation of the 2T-MFMFET has a serious access and interference problem. That is, when a memory cell is read, all memory cells on the same row/column are interfered. As a result, their arrays lack the random-access capabilities that are important for the cache and code storage. Moreover, they only demonstrated the 2T-MFMFET array architecture, and did not mention the array operation scheme.

S. Slesazeck et al. proposed "Uniting The Trinity of Ferroelectric HfO2 Memory Devices in a Single Memory Cell," 2019 IEEE 11th International Memory Workshop (IMW), 2019, pp. 1-4. In their paper, during the readout process, they pre-charge the floating gate voltage and then utilize a ferroelectric tunneling junction (FTJ) mechanism, where the speed of pre-charging the floating gate depends on the polarization state. The above techniques have a too long delay time and a too small memory window so that it is unfavorable to the writing of the memory and the reading of the state.

SUMMARY OF THE INVENTION

Ferroelectric based memory devices are of interest due to the compatibility of the ferroelectric HfZrO2 and advanced CMOS processes. In addition, the FeFET array structure is similar to the technology used to achieve 1 TB of the flash memory in the 3D NAND architecture. However, FeFETs suffer from high write voltage and reliability issues. The proposed invention improves operating voltage and reliability. Furthermore, the array can be accessed randomly without write disturb problems.

In view of the deficiencies of the prior art, the present disclosure proposes a metal ferroelectric metal field effect transistor, a metal ferroelectric metal field effect transistor array, and an operation method thereof, which can improve the serious access interference problem in the read and write operations, improve the memory reliability, and reduce operating voltage requirements.

In accordance with one aspect of the present invention, a metallic ferroelectric metal (MFM) field effect transistor (FET) is disclosed. The metallic ferroelectric metal (MFM) field effect transistor (FET) includes an MFM, a first FET and a second FET. The MFM has a first electrode. The first FET is electrically connected to the first electrode, and has a first gate electrode, wherein the first gate electrode has a first area. The second FET is electrically connected to the first electrode, and has a second gate electrode, wherein the second gate electrode has a second area, and the first area and the second area have a ratio therebetween ranging from 1:50 to 1:2.

In accordance with another aspect of the present invention, a metallic ferroelectric metal (MFM) field effect transistor (FET) array is disclosed. The metallic ferroelectric metal (MFM) field effect transistor (FET) array includes a plurality of MFMFETs forming a plurality of memory cells, each of which includes an MFM and a first FET, a word write line, a word line and a bit write line. The first FET has a first gate electrode and a first drain electrode. The word write line is electrically connected to the first gate electrode. The word line is electrically connected to the MFM. The bit write line is electrically connected to the first drain electrode, wherein the word write line is perpendicular to the word line and the bit write line.

In accordance with a further aspect of the present invention, an operation method for a memory array is disclosed. The memory array includes a plurality of memory cells, each of which includes a word write line, a bit write line, and a word line. The operation method including: accessing a first state of a selected memory cell from the plurality of memory cells; and (a1) when the memory array is of a first type, further comprising the following steps: enabling the word write line of the selected memory cell for a first duration; enabling the bit write line of the selected memory cell for a second duration, wherein the first duration is greater than the second duration; and disabling the word write line of the selected memory cell; and (a2) when the memory array is of a second type, further comprising the following steps: enabling the word write line of an unselected memory cell for a first duration; enabling the bit write line of the unselected memory cell for a second duration, wherein the first duration is greater than the second duration; and disabling the word write line of the unselected memory cell.

The above objectives and advantages of the present invention will become more readily apparent to those ordinarily skilled in the art after reviewing the following detailed descriptions and accompanying drawings, in which:

DETAILED DESCRIPTION OF THE PREFERRED EMBODIMENTS

Please read the following detailed description with reference to the accompanying drawings of the present disclosure. The accompanying drawings of the present disclosure are used as examples to introduce various embodiments of the present disclosure and to understand how to implement the present disclosure. The embodiments of the present disclosure provide sufficient content for those skilled in the art to implement the embodiments of the present disclosure, or implement embodiments derived from the content of the present disclosure. It should be noted that these embodiments are not mutually exclusive with each other, and some embodiments can be appropriately combined with another one or more embodiments to form new embodiments; that is, the implementation of the present disclosure is not limited to the examples disclosed below. In addition, for the sake of brevity and clarity, relevant details are not excessively disclosed in each embodiment, and even if specific details are disclosed, examples are used only to make readers understand. The present invention will now be described more specifically with reference to the following embodiments. It is to be noted that the following descriptions of the preferred embodiments of this invention are presented herein for the purposes of illustration and description only; they are not intended to be exhaustive or to be limited to the precise form disclosed.

Figure 1:
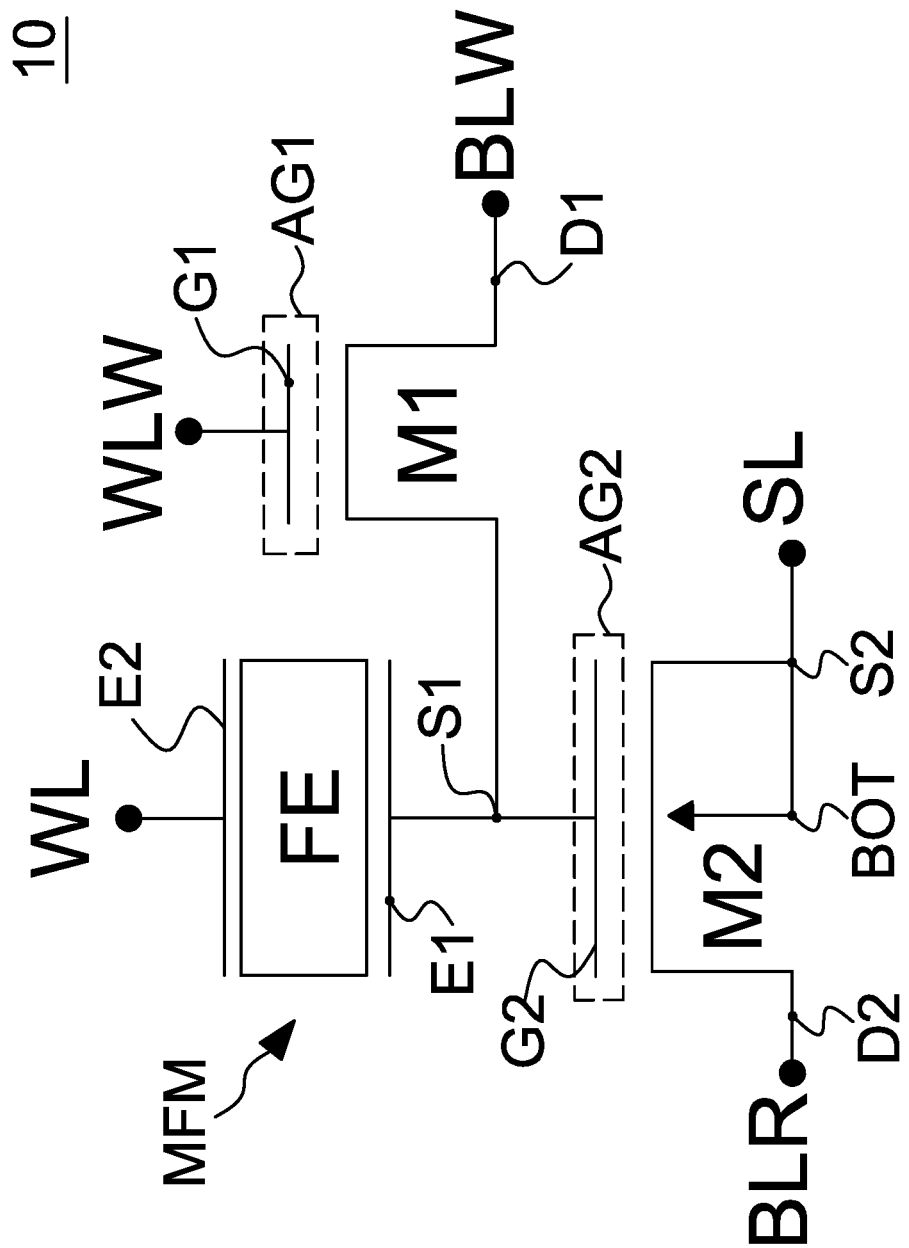
FIG. 1 is a schematic diagram showing a metal ferroelectric metal field effect transistor according to a preferred embodiment of the present disclosure.

Please refer to FIG. 1, which is a schematic diagram showing a metal ferroelectric metal (MFM) field effect transistor (FET) 10 according to a preferred embodiment of the present disclosure. The MFMFET 10 includes an MFM, a first FET M1, and a second FET M2. The MFM has a first electrode E1. The first FET M1 is electrically connected to the first electrode E1, and has a first gate electrode G1, wherein the first gate electrode G1 has a first area AG1. The second FET M2 is electrically connected to the first electrode E1, and has a second gate electrode G2, wherein the second gate electrode G2 has a second area AG2, the first area AG1 and the second area AG2 have a ratio, and the ratio ranges from 1:50 to 1:2.

When the first area AG1 and the second area AG2 have a ratio range from 1:50 to 1:2, the MFMFET 10 can have a lower write voltage, which is more favorable for memory applications having low power consumption.

In any embodiment of the present disclosure, the second source S2 of the second FET M2 is electrically connected to its body terminal BOT. In this ratio range, the operating voltage requirement when accessing the MFMFET 10 can be effectively reduced, and when reading the MFMFET 10, the ratio of the read current between different states can be significantly increased so that excellent reliability can be achieved.

In any embodiment of the present disclosure, the MFM further has a second electrode E2, the first electrode E1 is a bottom electrode, the second electrode E2 is a top electrode, and the second electrode E2 is electrically connected to a word line WL. The MFM contains a ferroelectric element FE. The first FET M1 further has a first drain electrode D1 and a first source electrode S1, the first drain electrode D1 is electrically connected to a bit write line BLW, and the first source electrode S1 is electrically connected to the first electrode E1. The second FET M2 further has a second drain electrode D2 and a second source electrode S2, the second drain electrode D2 is electrically connected to a bit read line BLR, and the second source electrode S2 is electrically connected to a source line SL.

In any of the disclosed embodiments, the MFMFET 10 can be used as a memory cell to form a memory array. Both the first and the second FETs M1, M2 are n-type FETs, or both are p-type FETs. When the first and the second FETs M1, M2 are both n-type FETs, an AND-type memory array can be formed; when both the first and the second FETs M1, M2 are p-type FETs, a NAND-type memory array can be formed. When no voltage is supplied to the word write line WLW, the bit write line BLW, the word line WL, and the bit read line BLR, the MFMFET 10 is a non-volatile memory.

Figure 2A:
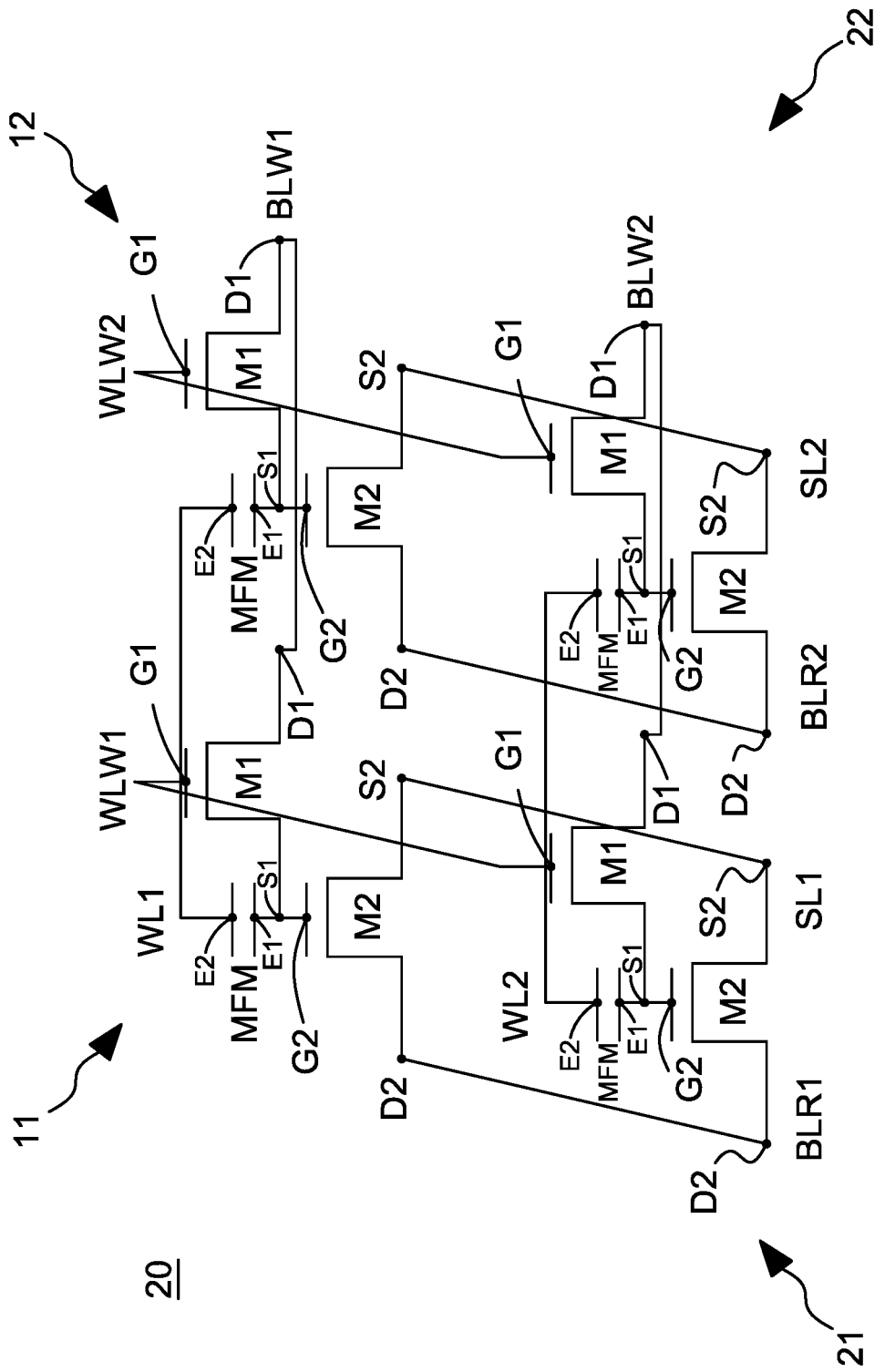
FIG. 2A is a schematic diagram showing an AND-type memory array according to a preferred embodiment of the present disclosure.

Please refer to FIG. 2A, which is a schematic diagram showing an AND-type memory array 20 according to a preferred embodiment of the present disclosure. Please refer to FIG. 2B, which is a schematic diagram showing another AND-type memory array 30 according to a preferred embodiment of the present disclosure. Please refer to FIG. 3A, which is a schematic diagram showing a NAND-type memory array 40 according to a preferred embodiment of the present disclosure. Please refer to FIG. 3B, which is a schematic diagram showing another NAND-type memory array 50 according to a preferred embodiment of the present disclosure. The memory arrays 20, 30, 40 and 50 are preferably MFMFET arrays. Please refer to FIGS. 2A, 2B, 3A, and 3B. Each MFMFET array includes a plurality of MFMFETs to form a plurality of memory cells, and each of the memory cells 11, 12, 21, 22, 11', 12', 21', 22' includes an MFM and a first FET M1. Each MFMFET array further includes a word write line WLW1, WLW2, a word line WL1, WL2, and a bit write line BLW1, BLW2. The word write lines WLW1, WLW2 are electrically connected to a first gate G1 of the first FETs M1. The word lines WL1, WL2 are electrically connected to the MFM respectively. The bit write lines BLW1, BLW2 are electrically connected to a first drain D1 of the first FET M1, wherein the word write lines WLW1, WLW2 are perpendicular to the word lines WL1, WL2 and the bit write lines BLW1, BLW2.

Figure 2B:
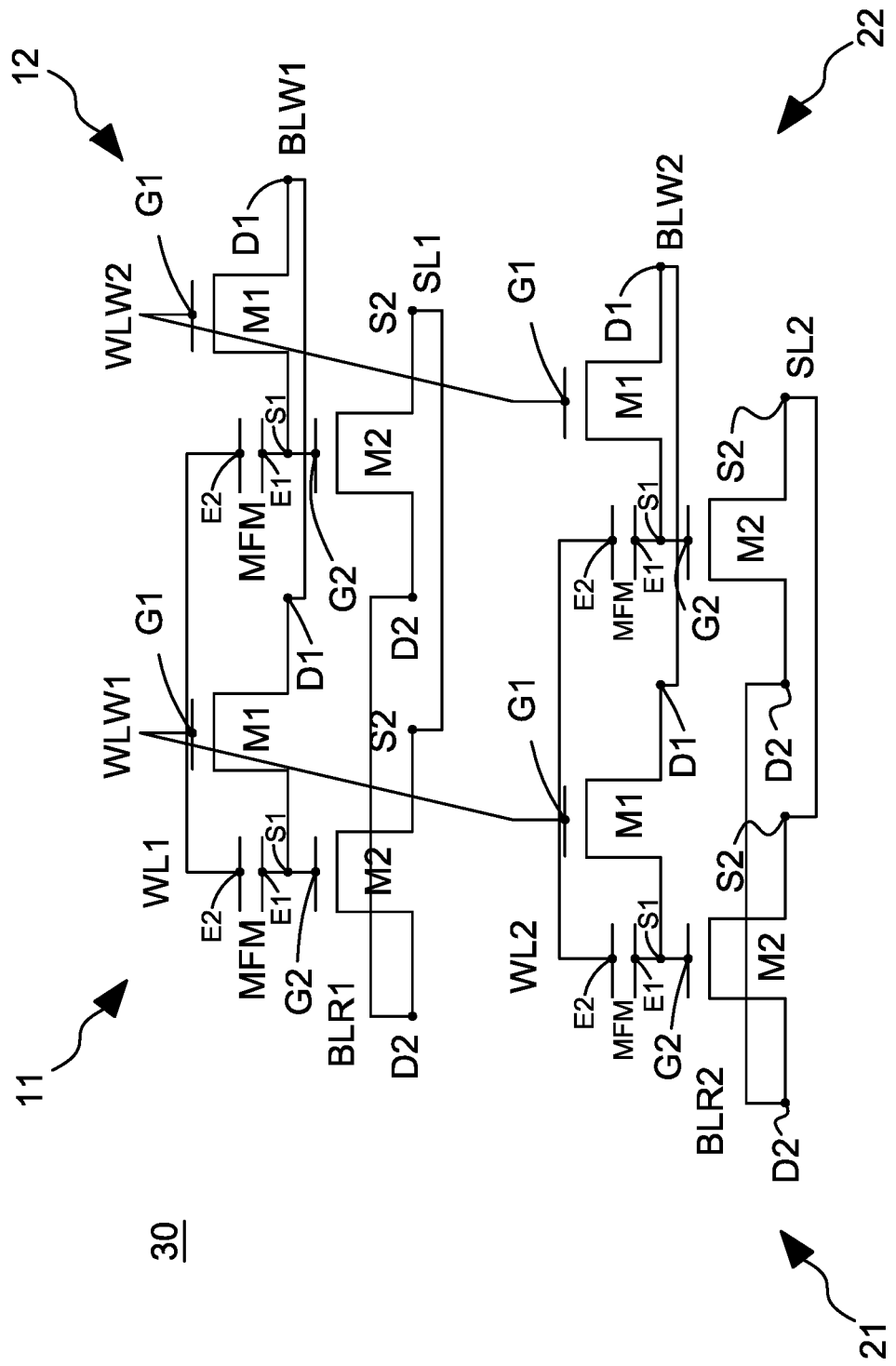
FIG. 2B is a schematic diagram showing another AND-type memory array according to a preferred embodiment of the present disclosure.

In FIGS. 2A and 2B, each of the MFM has a first electrode E1 and a second electrode E2, the first electrode E1 is electrically connected to the second gate G2 of the second FET M2 and the first source electrode S1 of the first FET M1, and the second electrode E2 is electrically connected to the word lines WL1, WL2. Each of the memory cells 11, 12, 21, 22 further includes a second FET M2, the first and the second FET M1, M2 are both n-type FETs, forming an AND-type memory array 20, 30. The second FET M2 has a second gate electrode G2, a second drain electrode D2, and a second source electrode S2. The structure of the AND-type memory arrays 20, 30 is as follows: the second drain electrode D2 of the second FETs M2 is electrically connected by a bit read lines BLW1, BLW2 (or the two second drain electrodes D2 of the adjacent memory cells are electrically connected together), and the second source electrodes S2 of the second FETs M2 are electrically connected through a source line SL1, SL2 (or the second source electrodes S2 of the adjacent memory cells are electrically connected together), wherein the structure of the memory array 20 is as follows: the word write lines WLW1, WLW2 are parallel to the bit read lines BLR1, BLR2 and the source lines SL1, SL2, as shown in FIG. 2A. The structure of the memory array 30 is as follows: the word write lines WLW1, WLW2 are perpendicular to the bit read lines BLR1, BLR2 and the source lines SL1, SL2, as shown in FIG. 2B.

Figure 3A:
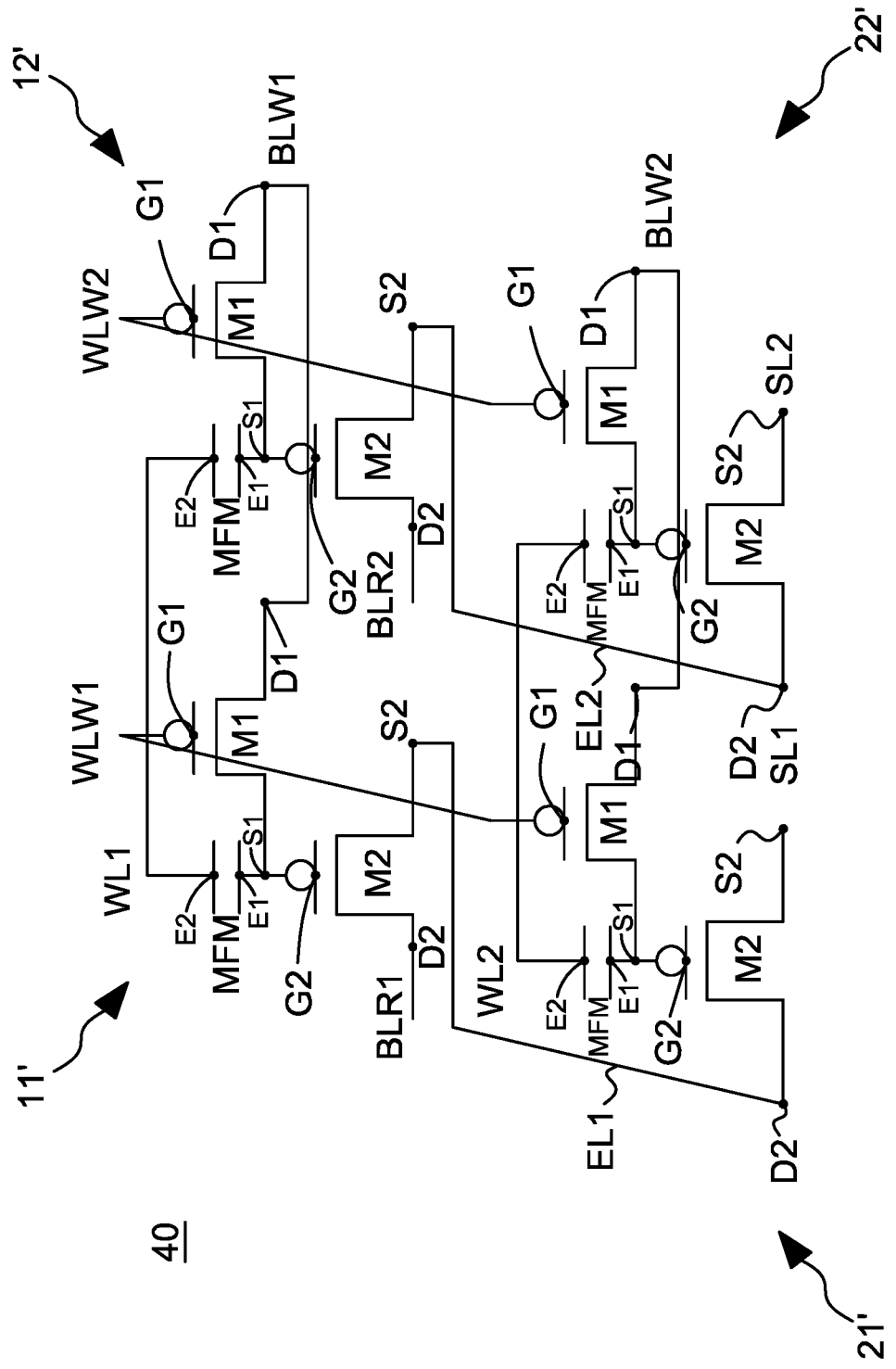
FIG. 3A is a schematic diagram showing a NAND-type memory array according to a preferred embodiment of the present disclosure.
Figure 3B:
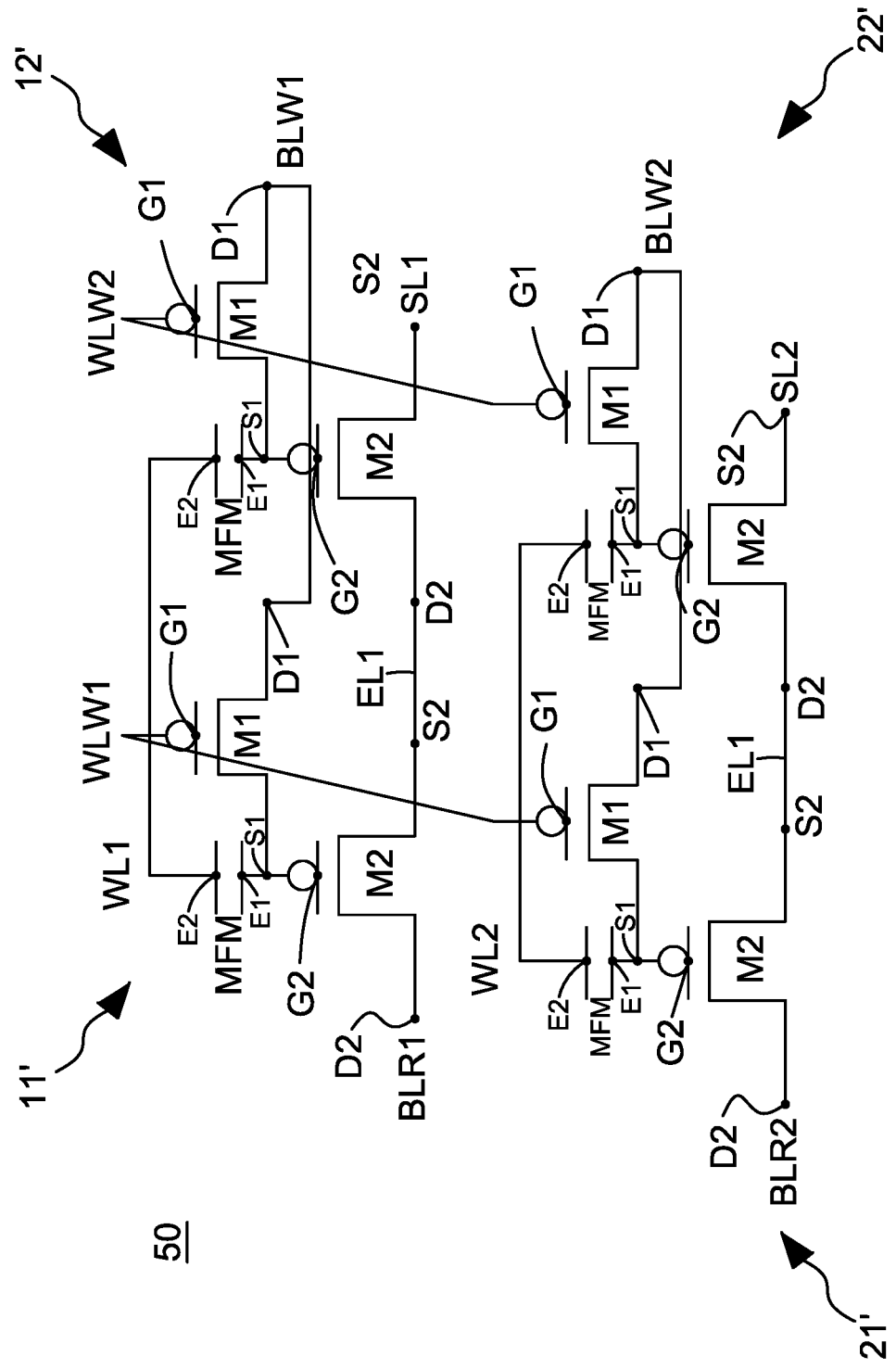
FIG. 3B is a schematic diagram showing another NAND-type memory array according to a preferred embodiment of the present disclosure.

In FIGS. 3A and 3B, each of the MFM has a first electrode E1 and a second electrode E2, the first electrode E1 is electrically connected to the second gate G2 of the second FET M2 and the first source electrode S1 of the FET M1, and the second electrode E2 is electrically connected to the word source line WL1, WL2. The memory cells 11', 12', 21', 22' further include a second FET M2, and the first and the second FET M1, M2 are both p-type FETs to form a NAND-type memory array 40, 50. The second FET M2 has a second gate electrode G2, a second drain electrode D2, and a second source electrode S2. The structure of the NAND-type memory arrays 40, 50 is as follows: the second drain electrode D2 of the second FET M2 of the adjacent memory cells is electrically connected to the second source electrode S2 to form an electrical connection line EL1, EL2, wherein the structure of the memory array 40 is as follows. The electrical connection lines EL1, EL2 are parallel to the word source write lines WLW1, WLW2, as shown in FIG. 3A. The structure of the memory array 50 is as follows: the electrical connection line EL1, EL2 are perpendicular to the word source write lines WLW1, WLW2, as shown in FIG. 3B.

In FIGS. 2A, 2B, 3A, and 3B, the proportional relationship between the area AG2 of the second gate G2 of the second FET M2 and the area AG1 of the first gate G1 of the first FET M1 can refer to the proportional range in FIG. 1. For simplicity, the area AG2 of the second gate electrode G2 and the area AG1 of the first gate electrode G1 in these figures are drawn in the same proportion, which only serve as schematic diagrams.

Figure 4A:
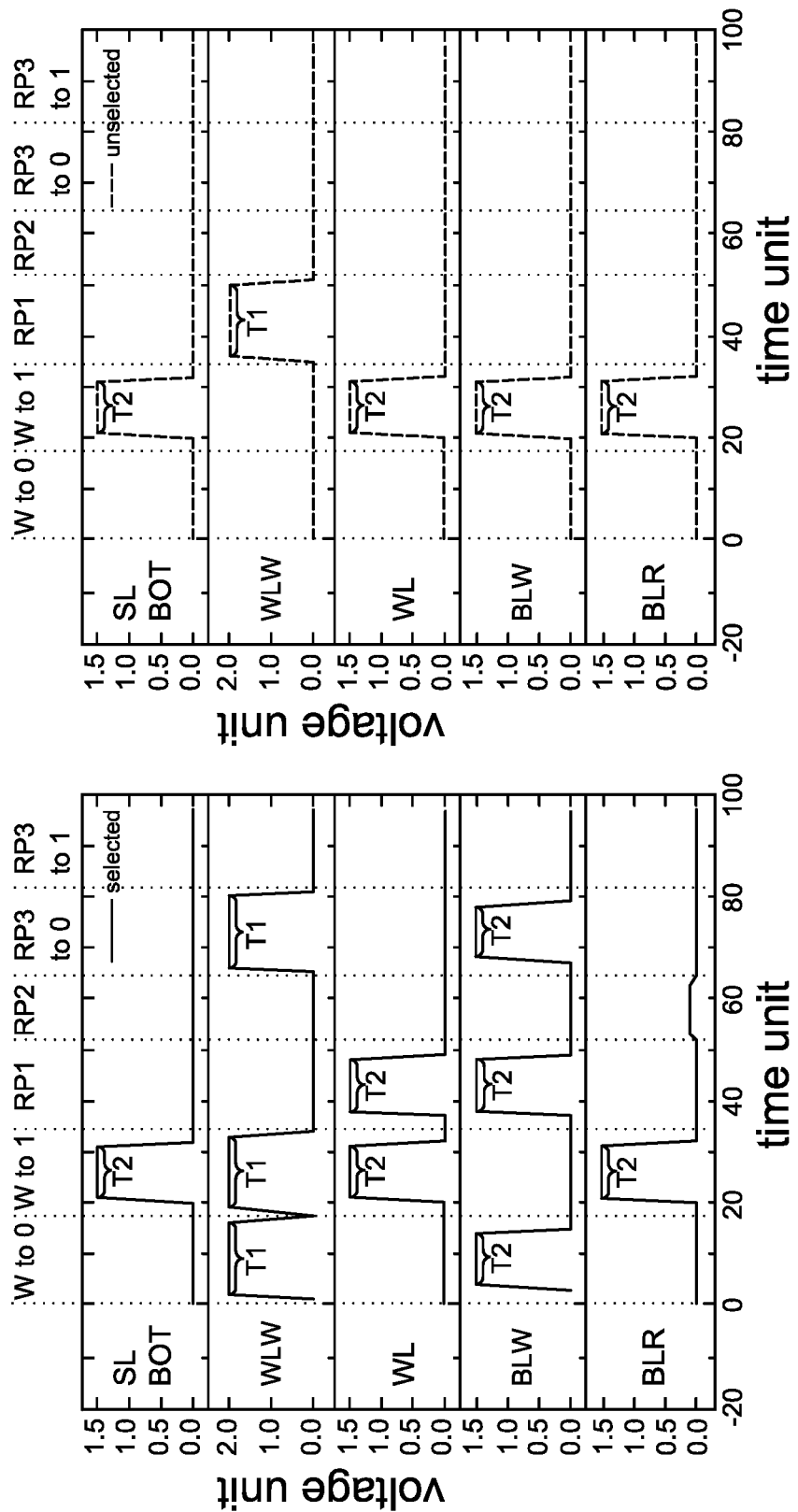
FIG. 4A is a schematic diagram showing an operation method applied to an AND memory array according to a preferred embodiment of the present invention.

Please refer to FIG. 4A, which is a schematic diagram showing the memory operation method of the memory array 20, 30 according to a preferred embodiment of the present disclosure, and is preferably applicable to the AND-type memory array. The solid lines in FIG. 4A represent the operation waveforms of the word write line WLW, the word line WL, the bit write line BLW, the bit read line BLR, and the source line SL to which the selected memory cell is electrically connected. The dashed lines therein represent the operation waveforms of the word write line WLW, the word line WL, the bit write line BLW, the bit read line BLR, and the source line SL to which the unselected memory cell is electrically connected. The horizontal axis represents the time, and the vertical axis represents the voltage. In FIG. 4A, the memory arrays 20, 30 are preferably applicable to AND-type memory arrays, especially memory arrays of AND-type MFMFETs, and the memory arrays 20, 30 include a plurality of memory cells, a word write line WLW, a bit write line BLW, and a word line WL. The operation method includes (a1) accessing a first state of the selected memory cell (e.g., writing 0), including the following Steps: enabling the word write line WLW of the selected memory cell for a first duration T1; enabling the bit write line BLW of the selected memory cell for a second duration T2, wherein the first duration T1 is greater than the second duration T2; and disabling the word write line WLW of the selected memory cell.

In any embodiment of the present disclosure, "all" memory cells represent "selected" memory cells and "unselected" memory cells, and the memory arrays 20, 30 are a metal Ferroelectric Metal (MFM) Field Effect Transistor (FET) array. The MFMFET array further comprises a read cell (not shown) electrically connected to a bit read line BLR and a source line SL, such as shown in FIG. 4A. The operation method in (a1) further comprises disabling the bit write line BLW of the selected memory cell. The operation method further comprises (b1) accessing a second state (e.g. write 1) of the selected memory cell, including the following steps: enabling the word write line WLW of the selected memory cell for the first duration T1; enabling the word line of all memory cells for the second duration T2, enabling the unselected bit write line BLW for the second duration T2, enabling all the bit read lines BLR for the second duration T2, and enabling all the source lines SL for the second duration T2, wherein the first duration T1 is greater than the second duration T2; disabling the word line WL of all memory cells, disabling the unselected bit write line BLW, disabling all the bit read line BLR, and disabling all the source lines SL; and disabling the word write line WLW of the selected memory cell.

It should be notable that the operating voltage of the source line SL, the body terminal BOT and the bit read line BLR can be equal to or less than that of the word line WL in (b1) whether it is selected or unselected. For example, in FIG. 4A, the operating voltage of the source line SL, the body terminal BOT and the bit read line BLR is a first specific value (e.g., 1.5 voltage unit), which is also that of the word line WL. However, the operating voltage of the source line SL, the body terminal BOT and the bit read line BLR can be less than the first specific value.

In any embodiment of the present disclosure, the operating method further includes (c1) reading a third state of the selected memory cell, and enabling the word write line WLW of the unselected memory cell for the first duration T1, as shown in the first read phase RP1 in FIG. 4A; enabling the word line WL and the bit write line BLW of the selected memory cell for the second time T2, wherein the first time T1 is greater than the second time T2, as shown in the first read phase RP1 in FIG. 4A; after disabling the word line WL of the selected memory cell and the bit write line BLW, disabling the word write line WLW of the unselected memory cell and enabling the bit read line BLR of the selected memory cell so that a current flows through the bit read line BLR, and reading the third state by the read unit, as shown in the second read phase RP2 in FIG. 4A; and disabling the bit read line BLR of the selected memory cell, and when the third state is the first state, repeat (a1) of the embodiment in FIG. 4A to write the first state into the selected memory cell in the plurality of memory cells, e.g.

as shown in RP3 to 0 of the third read phase RP3 in FIG. 4A. When both the selected memory cell and the unselected memory cell have no signal in the third read phase RP3, it means that the read state is the second state, and there is no need to repeat (b1) writing the second state to the selected memory cell of the plurality of memory cells, e.g. as shown in RP3 to 1 of the third read phase RP3 in FIG. 4A.

Figure 4B:
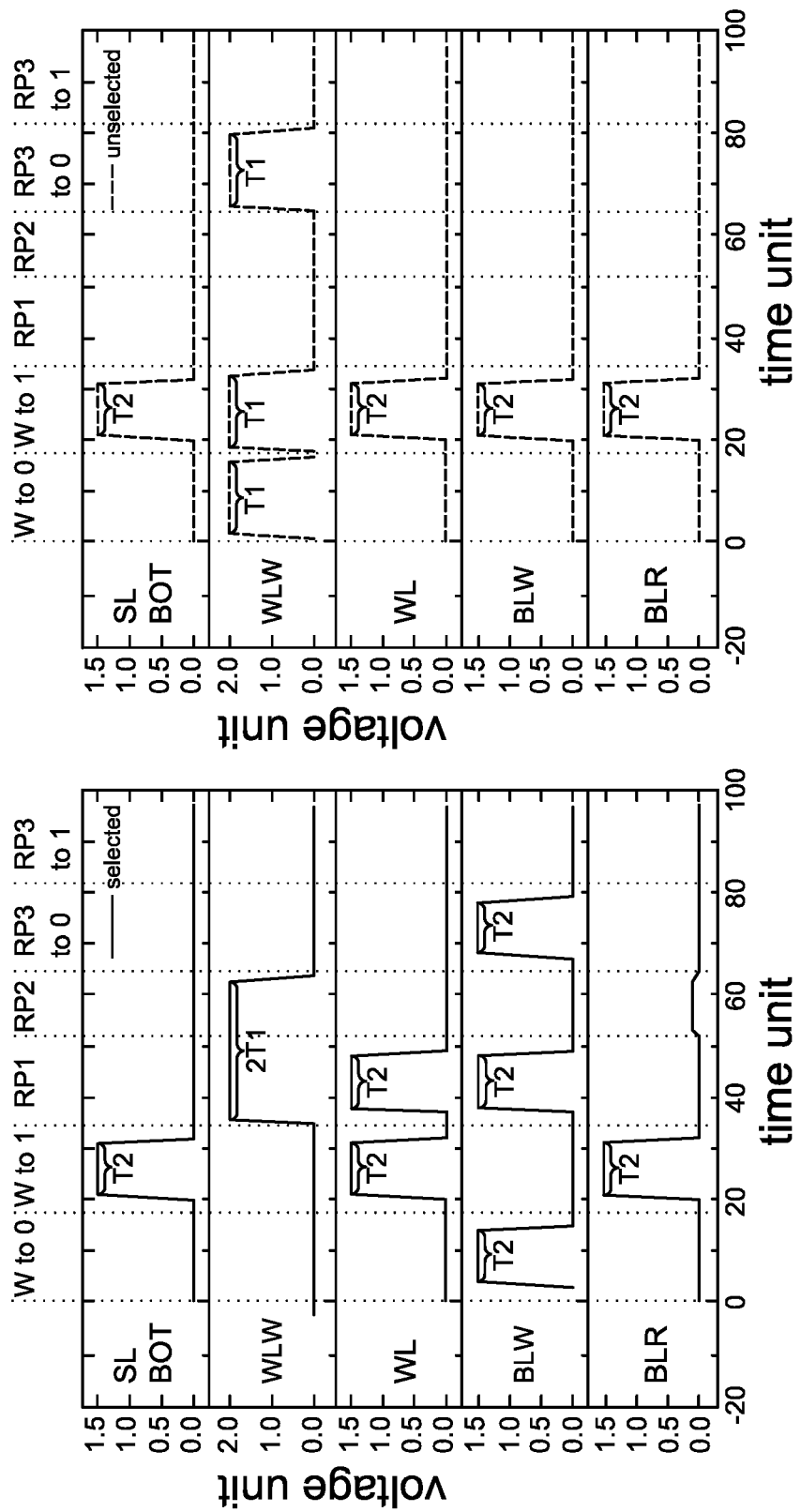
FIG. 4B is a schematic diagram showing an operation method applied to a NAND memory array according to a preferred embodiment of the present invention.

Please refer to FIG. 4B, which is a schematic diagram showing an operation method for selecting memory cells of another memory array 40, 50 according to a preferred embodiment of the present disclosure, which is preferably applicable to a NAND-type memory array. The solid lines in FIG. 4B represent the operation waveforms of the word write line WLW, the word line WL, the bit write line BLW, the bit read line BLR, and the source line SL to which the selected memory cell is electrically connected. The dash lines represent the operation waveforms of the word write line WLW, the word line WL, the bit write line BLW, the bit read line BLR, and the source line SL to which the unselected memory cell is electrically connected. The horizontal axis represents the time, and the vertical axis represents the voltage. In FIG. 4B, the memory arrays 40, 50 are preferably applicable to NAND-type memory arrays, especially NAND-type FMFFET memory arrays, and the memory arrays 40, 50 include a plurality of memory cells, a word write line WLW, a bit write line BLW, and a word line WL. The operation method includes (a2) accessing a first state of the selected memory cell (e.g. writing 0), including the following steps: enabling the word write line WLW of the unselected memory cell for a first duration T1; enabling the bit write line BLW of the selected memory cell for a second duration T2, wherein the first duration T1 is greater than the second duration T2; and disabling the word write line WLW of the unselected memory cells.

It should be notable that the operating voltage of the source line SL, the body terminal BOT and the bit read line BLR can be equal to or more than that of word line WL in (a2) whether it is selected or unselected. For example, in FIG. 4B, the operating voltage of the source line SL, the body terminal BOT and the bit read line BLR is a second specific value (e.g., 0 voltage unit), which is also that of the word line WL. However, the operating voltage of the source line SL, the body terminal BOT and the bit read line BLR can be more than the second specific value.

In any embodiment of the present disclosure, the memory array 40, 50 is a metal ferroelectric metal (MFM) field-effect transistor (FET), and the MFMFET array 40, 50 also includes a read unit (not shown) electrically connected to a bit read line BLR and a source line SL. For example, in FIG. 4B, the operation method in (a2) further includes disabling the word write line WLW of the unselected memory cell after disabling the bit write line BLW of the selected memory cell. The operating method further includes (b2) accessing a second state (e.g. writing 1), including the following steps: enabling the word write line WLW of the unselected memory cell for the first duration T1, and enabling the bit write line BLW of the unselected memory cell for the second duration T2; enabling the word lines WL of all the memory cells, and enabling all the bit read lines BLR and all the source lines SL, wherein the first duration T1 is greater than the second duration T2; disabling all word lines WL, bit read lines BLR, and source lines SL, and disabling the bit write lines BLW of the unselected memory cells; and disabling the word write line WLW of the unselected memory cells.

In any embodiment of the present disclosure, the operating method further includes (c2) reading a third state of the selected memory cell, enabling the word write line WLW of the selected memory cell for the first duration T1, and enabling the word line WL of the selected memory cell and the bit write line BLW for a second duration T2, wherein the first duration T1 is greater than the second duration T2, as shown in the first read phase RP1 in FIG. 4B; disabling the word line WL and the bit write line BLW of the selected memory cell; enabling the word write line WLW of the selected memory cell of the cell for the first duration T1, and enabling the bit read line BLR of the selected memory cell so that a current flows through the bit read line BLR, and the read unit reads the third state, as shown in the second read phase RP2 in FIG. 4B; disabling the bit read line BLR of the selected memory cell; and when the third state is the first state, repeating (a2) of the embodiment in FIG. 4B to write the first state into the selected memory cell of the plurality of memory cells, as shown in the third read phase RP3 in FIG. 4B. When both the selected memory cell and the unselected memory cell have no signal in the third read phase RP3, it means that the read state is the second state, and there is no need to repeat (b2) writing the second state to the selected memory cell of the plurality of memory cells.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A metallic ferroelectric metal (MFM) field effect transistor (FET) comprising:
   an MFM having a first electrode and a second electrode;
   a first FET electrically connected to the first electrode and having a first gate electrode, wherein the first gate electrode has a first area; and
   a second FET electrically connected to the first electrode and having a second gate electrode, a second drain electrode and a second source electrode;
   a word line directly and electrically connected to the second electrode;
   a bit read line electrically connected to the second drain electrode; and
   a source line electrically connected to the second source electrode, wherein:
   the second gate electrode has a second area, and
   the first area and the second area have a ratio therebetween ranging from 1:50 to 1:2.

2. The MFMFET as claimed in claim 1, wherein the second electrode serves as a top electrode, the first electrode serves as a bottom electrode, and the second gate electrode is electrically connected to the first electrode.

3. The MFMFET as claimed in claim 1, further comprising a bit write line, wherein the first FET further has a first drain electrode and a first source electrode, the first drain electrode is electrically connected to the bit write line, and the first source electrode is electrically connected to the first electrode.

4. The MFMFET as claimed in claim 1, wherein either of the first and the second FET is one of n-type and p-type.

5. The MFMFET as claimed in claim 1, further comprising a word write line, a bit write line, a word line, and a bit read line, wherein when no voltage is applied to any of the word write line, the bit write line, the word line, and the bit read line, the MFMFET is a non-volatile memory.

6. A metallic ferroelectric metal (MFM) field effect transistor (FET) array comprising:
a plurality of MFMFETs forming a plurality of memory cells, each of which includes:
an MFM having a first electrode and a second electrode;
a first FET electrically connected to the first electrode, and having a first gate electrode and a first drain electrode;
a second FET electrically connected to the first electrode;
a word write line electrically connected to the first gate electrode;
a word line directly and electrically connected to the second electrode of the MFM; and
a bit write line electrically connected to the first drain electrode, wherein: the word write line is perpendicular to the word line and the bit write line.

7. The MFMFET as claimed in claim 6, wherein the first and the second FET are both n-type, and the plurality of memory cells form an AND-type memory array.

8. The MFMFET as claimed in claim 7, wherein:
the second FET has a second gate electrode, a second drain electrode, and a second source electrode; and
the AND-type memory array has an architecture including:
the second gate electrode is electrically connected to the corresponding first electrode of the MFM;
the second drain electrode of each the respective second FET electrically connected by a bit read line;
the second source electrode of each the respective second FET electrically connected to a source line; and
the word write line of a specific memory cell either parallel to the bit read line and the source line of the specific memory cell or perpendicular to the bit read line and the source line.

9. The MFMFET as claimed in claim 6, wherein the first and the second FET are both p-type, and the plurality of memory cells form a NAND-type memory array.

10. The MFMFET as claimed in claim 9, wherein:
the second FET has a second gate electrode, a second drain electrode, and a second source electrode; and
the NAND-type memory array has an architecture wherein:
the second gate electrode is electrically connected to the corresponding first electrode of the MFM;
the second drain electrode and the second source electrode of the second FET between two specific adjacent memory cells are electrically interconnected to form an electrical connection line; and
the electrical connection line is either parallel or perpendicular to the word write lines of the two specific adjacent memory cells.

11. An operation method for a memory array comprising a plurality of memory cells, each of which includes a word write line, a bit write line, and a word line, the operation method comprising:
accessing a first state of a selected memory cell from the plurality of memory cells; and
(a1) when the memory array is of a first type, further comprising the following steps:
enabling the word write line of the selected memory cell for a first duration;
enabling the bit write line of the selected memory cell for a second duration, wherein the first duration is greater than the second duration; and
disabling the word write line of the selected memory cell; and
(a2) when the memory array is of a second type, further comprising the following steps:
enabling the word write line of an unselected memory cell for a first duration;
enabling the bit write line of the unselected memory cell for a second duration, wherein the first duration is greater than the second duration; and
disabling the word write line of the unselected memory cell.

12. The operation method as claimed in claim 11, wherein the memory array is of an AND type and is a metal ferroelectric metal (MFM) field effect transistor (FET) array, each of the memory cells further comprises a bit read line and a source line, the MFMFET array further includes a read unit electrically connected to the bit read line and the source line, and the operation method further includes:
(b1) accessing a second state of a selected memory cell from the plurality of memory cells, and comprising the following steps:
enabling the word write line of the selected memory cell for a first duration;
enabling the word lines of all memory cells for a second duration, enabling the bit write line of an unselected memory cell for the second duration, enabling the bit read lines of all of the memory cells for the second duration, and enabling the source lines of all of the memory cells for the second duration, wherein the first duration is greater than the second duration; and
disabling the word lines, the bit read lines, and the source lines of all of the memory cells, and disabling the bit write line of the unselected memory cell.

13. The operation method as claimed in claim 11, wherein the operation method further includes:
(c1) reading a third state of a selected memory cell from the plurality of memory cells:
enabling the word write line of an unselected memory cell for a first duration;
enabling the word line and the bit write line of the selected memory cell for a second duration, wherein the first duration is greater than the second duration;
disabling the word line and the bit write line of the selected memory cell;
disabling the word write line of an unselected memory cell, and enabling the bit read line of the selected memory cell, so that a current flows through the bit read line of the selected memory cell and the third state is read by the read unit; and
disabling the bit read line of the selected memory cell when the third state is the first state, repeating (a1) to write the first state to the selected memory cell in the plurality of memory cells.

14. The operation method as claimed in claim 11, wherein the memory array is of a NAND type and is a metal ferroelectric metal (MFM) field effect transistor (FET) array, each of the memory cells further comprises a bit read line and a source line, the MFMFET array further includes a read unit electrically connected to the bit read line and the source line, and the operation method further includes:
(b2) accessing a second state of a selected memory cell from the plurality of memory cells, and comprising the following steps:
enabling the word write line of an unselected memory cell for a first duration and enabling the bit write line of the unselected memory cell for a second duration, wherein the first duration is greater than the second duration;

enabling the word lines, the bit read lines and the source lines of all of the memory cells; and disabling the word lines, the bit read lines, and the source lines of all of the memory cells, and disabling the bit write line of the unselected memory cell; and disabling the word write line of the unselected memory cell.

15. The operation method as claimed in claim 11, wherein the memory array is of a NAND type and the operation method further includes:

(c2) reading a third state of a selected memory cell from the plurality of memory cells:

enabling the word write line of the selected memory cell for a first duration, and enabling the word line and the bit write line of the selected memory cell for a second duration;

enabling the word write line of the selected memory cell for the first duration, disabling the word line and the bit write line of the selected memory cell, and enabling the bit read line of the selected memory cell, so that a current flows through the bit read line of the selected memory cell, and the third state is read by the read unit;

disabling the word write line of the selected memory cell; and when the third state is the first state, repeating (a2) to write the first state into the selected memory cell of the plurality of memory cells.

* * * * *